United States Patent [19]

Gheewala et al.

[11] Patent Number: 4,533,840
[45] Date of Patent: Aug. 6, 1985

[54] SOLITON SAMPLER

[75] Inventors: Tushar R. Gheewala, Yorktown Heights; Steven B. Kaplan, LaGrangeville, both of N.Y.

[73] Assignee: International Business Machines Corporation, Armonk, N.Y.

[21] Appl. No.: 417,818

[22] Filed: Sep. 13, 1982

[51] Int. Cl.³ .................. H03K 17/92; H03K 3/38
[52] U.S. Cl. ............................ 307/306; 307/352; 357/5; 365/162
[58] Field of Search .......... 307/352, 306; 357/5; 365/162

[56] References Cited

U.S. PATENT DOCUMENTS

| | | | |
|---|---|---|---|
| 3,764,905 | 10/1973 | Zappe | 307/306 |
| 3,936,677 | 2/1976 | Fulton et al. | 307/306 |
| 4,245,169 | 1/1981 | Hamilton | 307/352 |
| 4,361,768 | 11/1982 | Rajeevakumar | 307/306 |
| 4,401,900 | 8/1983 | Faris | 307/352 |

OTHER PUBLICATIONS

Chi et al., "Picosecond Sampling Techniques Using Superconducting Switches", IBM Technical Disclosure Bulletin, vol. 24, No. 4, Sep. 1981, pp. 2007–2009.
Tuckerman, D. B., "A Josephson Ultrahigh-Resolution Sampling System", Applied Physics Letters, vol. 36, No. 12, Jun. 1980, pp. 1008–1010.
C. J. Anderson, D. J. Herrell and M. B. Ketchen, "Limited I/O Josephson Sampler," IBM Technical Disclosure Bulletin, vol. 24, No. 8, Jan. 1982, pp. 4079–4082.
D. J. Bergman, E. Ben Jacob, Y. Imry and K. Maki, "Sine–Gordon Solitons—Particles Obeying Relativistic Dynamics," Jul. 1981.
A. Hasegawa and Y. Kodama, "Signal Transmission by Optical Solitons in Monomode Fiber", Proceedings of the IEEE, vol. 69, No. 9, Sep. 1981, pp. 1145–1150.
A. Matsuda and H. Yoshikiyo, "Pulse Response Properties of Josephson Transmission Lines and Their Application to Logic Circuits", Journal of Applied Physics, 52(9), Sep. 1981, pp. 5727–5731.
T. V. Rajeevakumar, "A Josephson Vortex-Flow Device", Applied Physics Letter 39(5), Sep. 1 1981, pp. 439–441.
P. L. Christiansen, J. C. Eilbeck, P. S. Lomdahl, A. C. Scott and O. H. Soerensen, "On the Internal Dynamics of Long Josephson Junction Oscillators".

Primary Examiner—John Zazworsky
Attorney, Agent, or Firm—Carl C. Kling

[57] ABSTRACT

The invention is an all-soliton sampler for accessing very high speed circuits. A soliton is switched in two parallel branches, one including the device-under-test and the other including a programmable delay line implemented in soliton devices. The outputs of these two branches are used as controls to a soliton comparator which, in turn, controls a Josephson detector gate. This circuit permits a relatively slow rise time external trigger pulse to initiate an extremely narrow sampling pulse.

3 Claims, 3 Drawing Figures

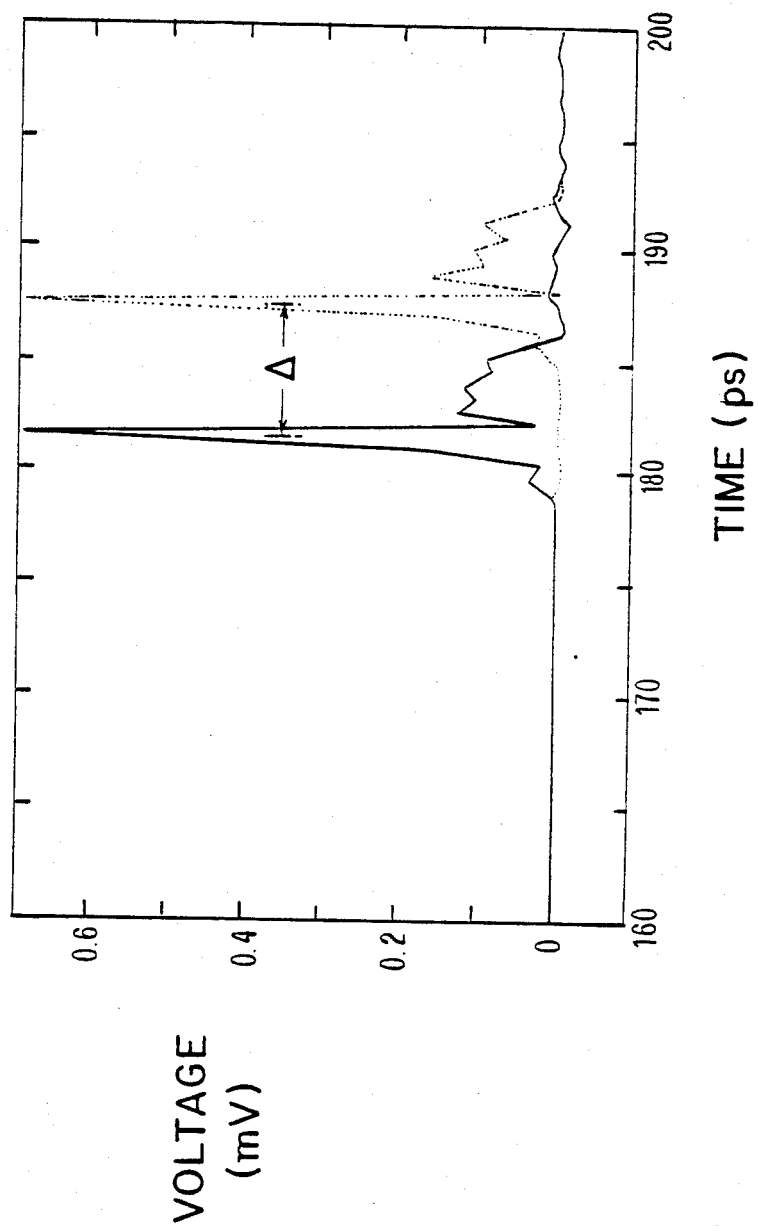

SOLITON SAMPLER

BACKGROUND OF THE INVENTION

1. Field of the Invention

The invention relates to superconductive circuits, and particularly to a soliton sampler for super-conductive circuits.

2. Description of the Prior Art

There are sampling circuits availble for super-conductive circuits. These sampling circuits, which sample the output waveform of the device under test, normally require sampling pulses of very narrow width and very fast rise time.

Such pulses are subject to jitter and crosstalk. There is a tradeoff relationship between jitter and crosstalk; very fast rise times minimize jitter, but the resulting increased flux increases induced crosstalk in neighboring conductors.

SUMMARY OF THE INVENTION

The invention is an all-soliton sampler for measuring the output waveform of very high speed circuits. A soliton is directed into two parallel branches, one including the device under test and the other including a programmble delay line implemented in soliton devices. The outputs of these two branches are used as controls to a soliton comparator which, in turn, controls a Josephson detector gate. This circuit permits a relatively slow rise time external trigger pulse to initiate an extremely narrow sampling pulse.

An object of the invention is to reduce the width of the sampling pulse to the picosecond range, in order to obtain better sampling resolution. In comparison, it is very difficult to obtain a resolution of 1 ps with the conventional Josephson sampler.

In the soliton sampler according to this invention, extremely narrow test-gate trigger signals and sampling pulses (of width $\lesssim 1$ ps) are generated simultaneously by an external trigger with a relatively long rise time. The addition of an on-chip programmable delay circuit allows high-resolution sampling to be done without appreciable jitter. Problems with crosstalk are alleviated by allowing a long rise time on the external trigger.

BRIEF DESCRIPTION OF THE DRAWINGS

FIG. 3 is a waveform of operation.

DESCRIPTION OF THE PREFERRED EMBODIMENT

Figure 1:
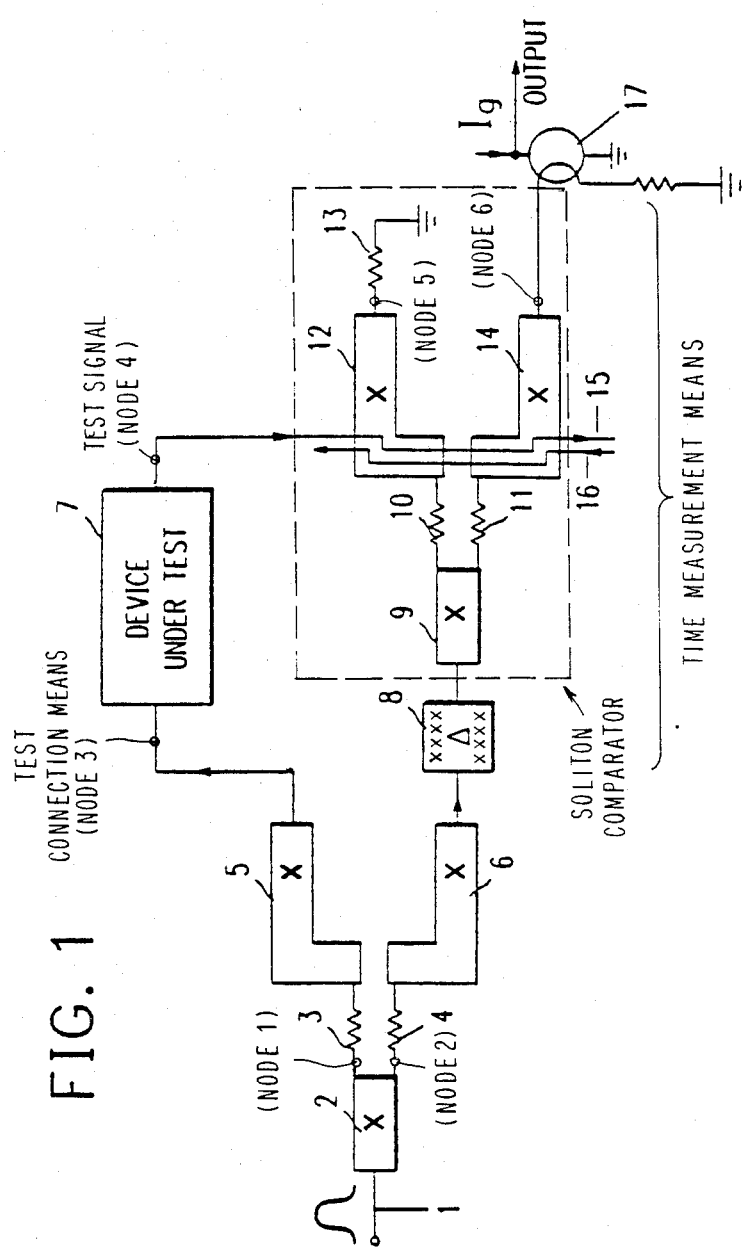
FIG. 1 is a schematic diagram of the invention.

FIG. 1 is a schematic diagram of the invention. Input terminal 1 receives an input signal from a relatively long rise time external source, for triggering a soliton. The soliton, which will be more specifically defined and described in the paragraph following this paragraph, may be thought of as an energy wave generated by long Josephson junction 2 and propagating through the mechanism 3-16 to provide a control signal to output device 17. The generated soliton follows the length of long Josephson junction 2, and divides equally at Nodes 1 and 2 via respective resistances 3, 4 into respective forked soliton device pathways 5, 6. Solitons progagate in each of the two branches. One soliton from fork 5 at Node 3 propagates through test connection means Node 3 to device-under-test 7 onto line 15. at Node 4.

The other soliton from fork 6 propagates through programmable delay 8 onto forked soliton device 9, 10, 11, 12 and 14 to Nodes 5 and 6; a signal (from device-under-test 7) at Node 4 on line 15 overcomes bias from line 16, enabling soliton fork 14 at Node 6 so as to permit the soliton to activate output device 17. On the other hand, if the signal on line 15 is smaller than the bias on line 16, then the soliton is dissipated at Node 5 in resistance 13.

The partial differential equation known as the sine-Gordon equation has among its solutions those which are called solitary waves. These waves propagate without fundamental changes in shape because of the nonlinear properties of the media which the equation describes. Solitons are those solutions which represent particle-like wave packets which under certain conditions may pass through each other without suffering a loss of identity.

The equation describing wave propagation in a long Josephson junction is a perturbed sine-Gordon equation. The soliton solutions represent the motion of magnetic vortices or fluxons which are accelerated by the Josephson tunnel current. The motion of these (and any other types of) sine-Gordon solitons obeys the laws of special relativity, in that as the fluxons are accelerated, they narrow in spacial width; the voltage pulse associated with the excitation grows accordingly. A Josephson soliton which is traveling at non-relativistic velocities has a width of $\sim 2\pi \lambda_J$, where $\lambda_J$ is the so-called Josephson penetration depth. The properties of Josephson junctions with current densities of a few $kA/cm^2$ and junction transmission line velocities of $\sim 0.02$ times the speed of light result in soliton voltage pulses of $\sim$ picosecond duration. The narrowing of pulses due to relativistic acceleration during transmission through the junction yields the possibility of entry into the sub-picosecond domain.

Long Josephson junction 2 is of length greater than two Josephson penetration depths; it thus generates a soliton which is dissipated in resistances 3 and 4 at the same time, launching a soliton in each of branches 5 and 6 of a forked-shape junction. A DC bias current is fed to each of these branches to insure only forward soliton propagation. The soliton in branch 6 is delayed in soliton delay circuit 8; it is then fed to soliton comparator 9-14, which includes another forked-shaped soliton device 12,14. The soliton in 5 is used to trigger the device-under-test 7. The output from device-under-test 7 is fed as a control current on conductor 15 to the comparator. The other control signal is a DC bias signal on conductor 16. The algebraic sum of signals on conductors 15 and 16 determines whether the sampling soliton is converted to a voltage pulse at the output of the detector gate 17 or whether the sampling soliton is dissipated in resistance 13.

Feedback may be employed to maintain a predetermined fraction of detected pulses in output device 17.

Figure 2:
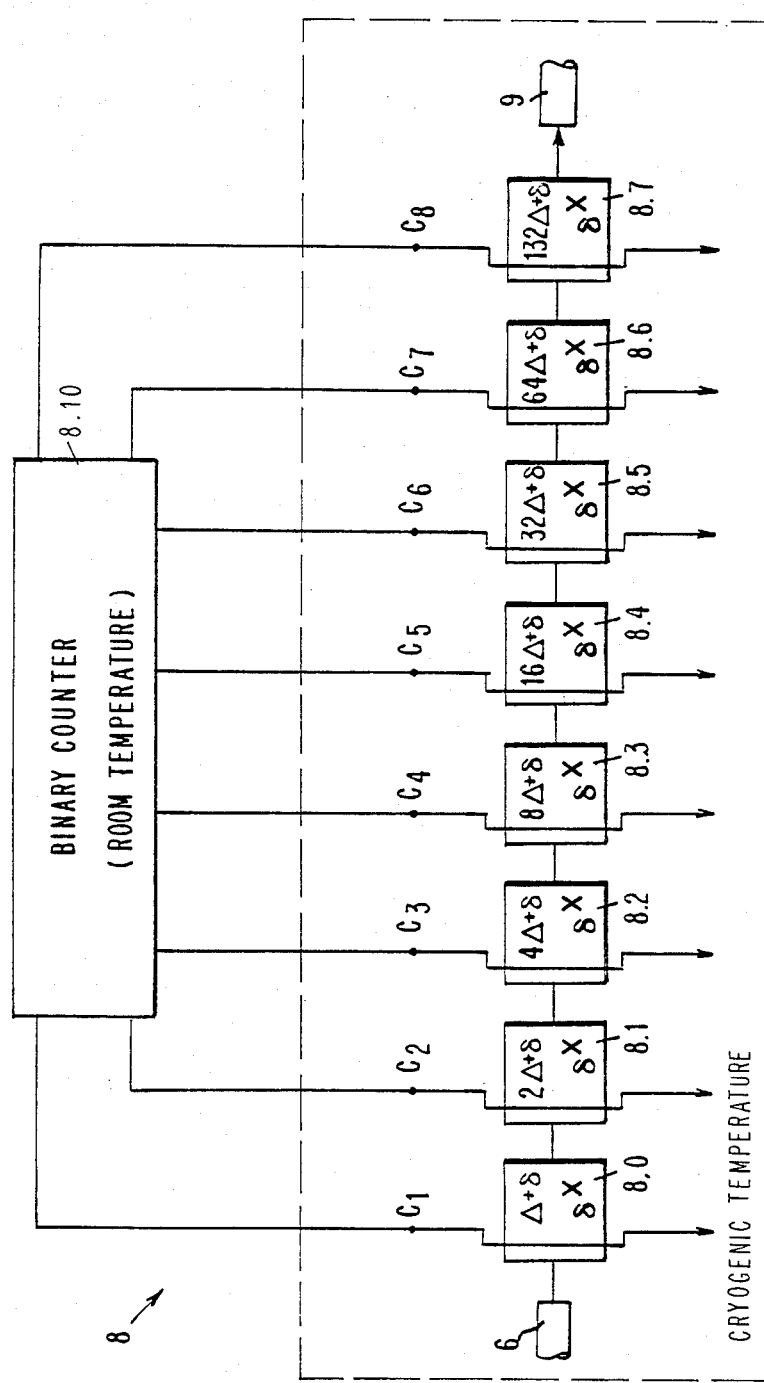
FIG. 2 is a schematic diagram of the programmed delay unit in the preferred embodiment.

The on-chip delay circuit 8 may take many forms. One method is shown in FIG. 2. The input soliton is fed to input 6 of an array of forked-shaped junctions. One may, for instance, desire the capability for 256 time increments $\Delta$, yielding the necessity of an eight-bit array with junctions 8.0-8.7 of time delays that are approximately integral multiples of $\Delta$. The minimum delay is $8\delta$, where $\delta \gg \Delta$, while the maximum delay is $255\Delta + 8\delta$. A binary counter 8.10 controls inputs C1, C2, ... C8, according to its setting which determine the appropriate path for the soliton. Backward propagation of the signal is prevented by resistors similar to 3–4 and bias lines similar to 16 shown in FIG. 1. The soliton is ultimately fed to soliton comparator 9, which is the input path to a forked soliton device 12,14. A forked soliton input 9. A simulation of the output pulses from a single stage of such a delay line is described in FIG. 3.

All soliton-bearing junctions must be supplied with a DC bias. This may be accomplished either with directly-injected currents or by magnetically-induced circulating currents.

The ultimate resolution of this device is limited by the width of the detected voltage pulses, which as shown in FIG. 3, may be of ~1 ps duration. The properties of solitons (to propagate without dispersion, in contrast to signals in conventional superconducting devices) ensure that signals are not degraded in the pulse generator, delay junctions or comparator junctions.

Problems associated with crosstalk are avoided by being able to use a slowly-rinsing trigger pulse. Jitter is minimized by the on-chip delay scheme.

It is emphasized that although Josephson junctions are used to generate and propagate the solitons, the solitary-wave phenomena used in the sampler are not confined to superconductivity per se, and are not contained in the body of phenomena originally predicted by Josephson.

Having thus described our invention, what we claim as new and desire to secure by Letters Patent is:

1. A sampling circuit, for a device-under-test, characterized by:
    (a) a soliton generator 2 to provide first and second soliton generator output nodes (Node 1, Node 2);
    (b) connection means (Node 3) for connecting a device-under-test 7 to the first output node (Node 1) of said soliton generator 2 to provide a test signal at a test signal node (Node 4);
    (c) time measurement means including a programmable delay line 8 and soliton comparator 9–14 connected to the second output node (Node 2) of said soliton generator 2, said soliton comparator having first and second soliton comparator output nodes (Node 5, Node 6);
    (d) termination means 13 connected to the first output node (Node 5) of said time measurement means 8–14;
    (e) detection means connected to the second output node of said time measurement means;
    (f) test control means 15 connected to said test signal node (Node 4) and connected across said soliton comparator 9–14; and
    (g) sampling control means 16 connected in control mode across said soliton comparator 9–14.

2. A sampling circuit according to claim 1, further characterized in that:
    said time measurement means (c) is made up of an array of long Josephson junctions 8.0–8.7 (FIG. 2), a respectively related array of control bias conductors C1–C8, and a counter 8.10 having a control setting and operably connected to said array of control bias conductors C1–C8 to provide for delay according to said control setting of said counter 8.10.

3. A sampling circuit according to claim 2, further characterized in that:
    said counter 8.10 of said time measurement means 8–14 may be kept in a room temperature range environment; and
    said array of long Josephson junctions 8.0–8.7 (FIG. 2) is kept in a cryogenic temperature envoronment.

* * * * *